United States Patent
Parkhe et al.

(10) Patent No.: US 9,608,549 B2
(45) Date of Patent: Mar. 28, 2017

(54) ELECTROSTATIC CHUCK

(71) Applicant: APPLIED MATERIALS, INC., Santa Clara, CA (US)

(72) Inventors: Vijay D. Parkhe, San Jose, CA (US); Steven V. Sansoni, Livermore, CA (US); Cheng-Hsiung Matthew Tsai, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 13/630,136

(22) Filed: Sep. 28, 2012

(65) Prior Publication Data
US 2013/0088808 A1 Apr. 11, 2013

Related U.S. Application Data

(60) Provisional application No. 61/542,068, filed on Sep. 30, 2011.

(51) Int. Cl.
*H01L 21/683* (2006.01)
*H02N 13/00* (2006.01)

(52) U.S. Cl.
CPC ......... *H02N 13/00* (2013.01); *H01L 21/6833* (2013.01)

(58) Field of Classification Search
USPC .......................................... 361/234
See application file for complete search history.

(56) References Cited

U.S. PATENT DOCUMENTS

| | | | | |
|---|---|---|---|---|
| 5,815,366 A | * | 9/1998 | Morita et al. | 361/234 |
| 6,034,863 A | * | 3/2000 | Marohl et al. | 361/234 |
| 6,108,189 A | * | 8/2000 | Weldon et al. | 361/234 |
| 6,141,203 A | * | 10/2000 | Sherman | 361/234 |
| 7,480,129 B2 | * | 1/2009 | Brown et al. | 361/234 |
| 7,692,916 B2 | * | 4/2010 | Matsumoto et al. | 361/234 |
| 7,848,077 B2 | | 12/2010 | Mizuno et al. | |
| 9,177,846 B2 | * | 11/2015 | Kawamura | C23C 16/4585 |
| 2002/0050246 A1 | | 5/2002 | Parkhe | |

(Continued)

FOREIGN PATENT DOCUMENTS

| | | |
|---|---|---|
| EP | 1 708 241 A1 | 4/2006 |
| JP | 6143075 A | 5/1994 |

(Continued)

OTHER PUBLICATIONS

U.S. Appl. No. 13/630,196, filed Sep. 28, 2012, Parkhe et al.

(Continued)

*Primary Examiner* — Ann Hoang
(74) *Attorney, Agent, or Firm* — Moser Taboada; Alan Taboada

(57) ABSTRACT

Embodiments of electrostatic chucks are provided herein. In some embodiments, an electrostatic chuck for retaining a substrate includes a base plate, a ceramic plate, supported by the base plate, having a substrate supporting surface, a first plurality of electrodes disposed within the ceramic plate having a first polarity, and a second plurality of electrodes disposed within the ceramic plate having a second polarity opposite from the first polarity, wherein the first and second plurality of electrodes are independently controllable to provide a desired chucking power and frequency.

19 Claims, 4 Drawing Sheets

(56) References Cited

U.S. PATENT DOCUMENTS

| | | |
|---|---|---|
| 2005/0095776 A1 | 5/2005 | Usuami |
| 2006/0245138 A1* | 11/2006 | Koh et al. .................... 361/234 |
| 2008/0062611 A1 | 3/2008 | Himori et al. |
| 2009/0201622 A1 | 8/2009 | Brown et al. |
| 2010/0122774 A1 | 5/2010 | Makabe et al. |
| 2010/0271745 A1 | 10/2010 | Chen et al. |

FOREIGN PATENT DOCUMENTS

| | | |
|---|---|---|
| JP | H09-167794 A | 6/1997 |
| JP | 2001-021281 A | 1/2001 |
| JP | 2008-228188 A | 9/2008 |

OTHER PUBLICATIONS

International Search Report and Written Opinion mailed Dec. 26, 2012 for PCT Application No. PCT/US2012/057945.
Search Report from The State Intellectual Property Office of the People's Republic of China received for Chinese Application No. 2012800478949 dated Nov. 16, 2015.
Search Report for Taiwan Invention Patent Application No. 101135973 dated Jul. 29, 2017.

* cited by examiner

ELECTROSTATIC CHUCK

CROSS-REFERENCE TO RELATED APPLICATIONS

This application claims benefit of U.S. provisional patent application Ser. No. 61/542,068, filed Sep. 30, 2011, which is herein incorporated by reference.

FIELD

Embodiments of the present invention generally relate to electrostatic chucks for supporting substrates.

BACKGROUND

Electrostatic chucks may be utilized to secure a substrate to be processed to a substrate support. Elements of an electrostatic chuck may include electrodes to secure the substrate and grooves disposed in a surface of the electrostatic chuck to provide a back side gas to a backside surface of the substrate.

Typical electrostatic chucks may include electrodes that provide strong chucking forces, but do not provide control for partial chucking during dechucking. In addition, these electrodes can give uneven chucking force from side to side. Furthermore, in some electrostatic chucks with grooves, substrate cool down rates in the center and at the edges of the substrate may be insufficient. In addition, arcing may be seen in the gas grooves beneath the substrate. Such elements of the electrostatic chuck may affect processing of the substrate. Accordingly, improved electrostatic chuck designs are provided herein.

SUMMARY

Embodiments of electrostatic chucks are provided herein. In some embodiments, an electrostatic chuck for retaining a substrate includes a base plate, a ceramic plate, supported by the base plate, having a substrate supporting surface, a first plurality of electrodes disposed within the ceramic plate having a first polarity, and a second plurality of electrodes disposed within the ceramic plate having a second polarity opposite from the first polarity, wherein the first and second plurality of electrodes are independently controllable to provide a desired chucking power and frequency.

In some embodiments, an electrostatic chuck includes a base plate, a ceramic plate, supported by the base plate, having a substrate supporting surface, at least one electrode disposed within the ceramic plate, and a plurality of grooves formed in the substrate supporting surface of the ceramic plate, wherein the plurality of grooves include one or more circular grooves disposed concentrically about a central axis of the ceramic plate, one or more radial grooves fluidly coupled to the one or more concentric circular grooves, and one or more non-radial offset grooves fluidly coupled to the one or more concentric circular grooves.

In some embodiments, an apparatus for processing a substrate includes a chamber defining a process region, an electrostatic chuck for retaining a substrate in the process region, the electrostatic chuck including a base plate, a ceramic plate, supported by the base plate, having a substrate supporting surface, a plurality of electrodes disposed within the ceramic plate, wherein each of the plurality of electrodes is separately controllable, a plurality of grooves formed in the substrate supporting surface of the ceramic plate, wherein the plurality of grooves include one or more circular grooves, one or more radial grooves, and one or more non-radial offset grooves, and a plurality of power sources, each power source coupled to a corresponding electrode in the plurality of electrodes such that each electrode is independently controlled.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
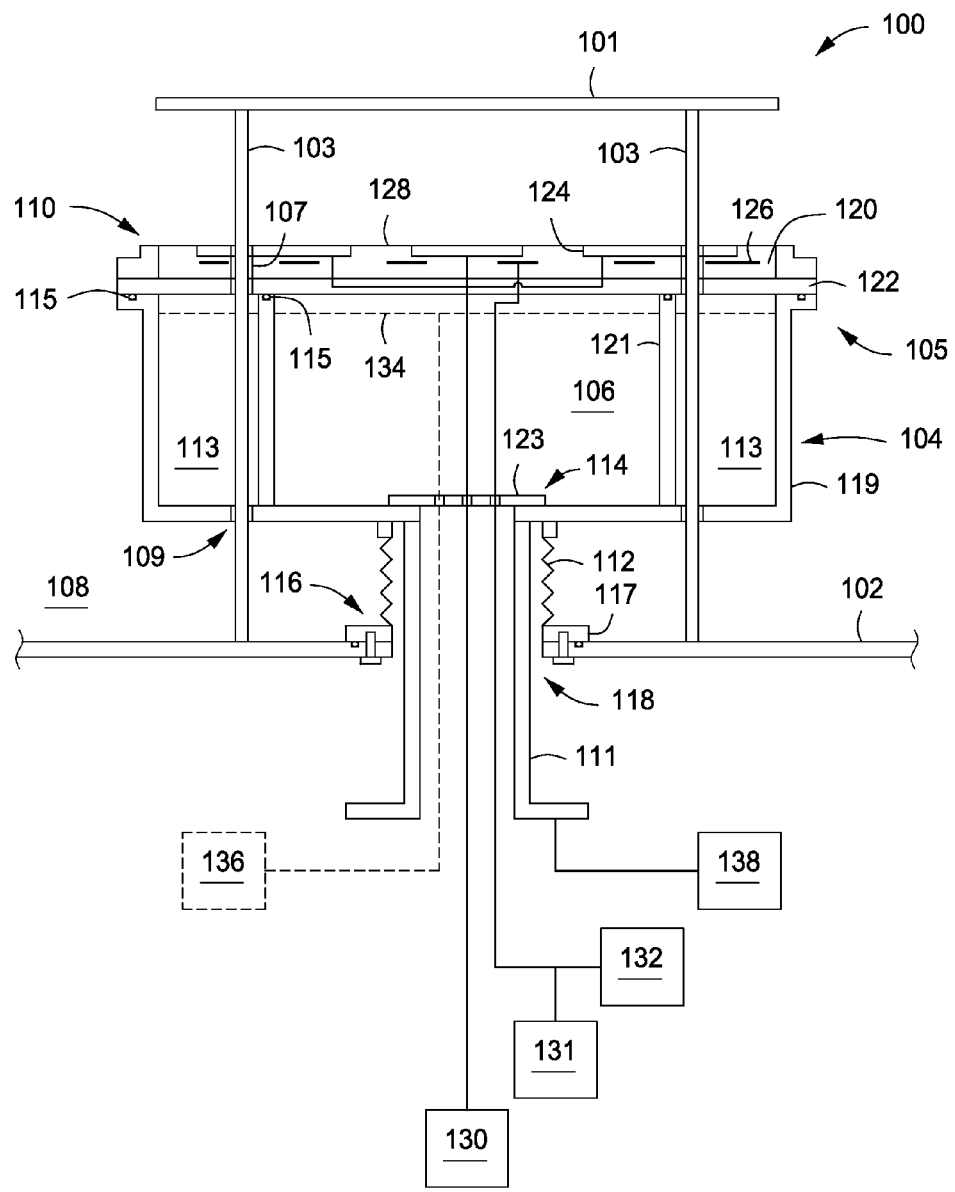
FIG. 1 depicts a side schematic view of a substrate support in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of electrostatic chucks are provided herein. The inventive apparatus may advantageously provide improved substrate processing, for example, such as by limiting arcing between a plasma and elements of the substrate support and/or by controllably adjusting the amount of chucking power provided by the electrostatic chuck to regions of a substrate disposed thereon. Further, the electrostatic chuck may be mounted such that it may be detachable and/or replaceable. In some embodiments, the substrate support may be utilized at low temperatures, for example, ranging from about −40 to about 250 degrees Celsius. In some embodiments, the substrate support may be utilized with substrates having diameters greater than about 400 millimeters. Other and further advantages are discussed below.

FIG. 1 depicts a side schematic view of a substrate support 100 in accordance with some embodiments of the present invention. As illustrated in FIG. 1, the substrate support 100 is configured in a loading position to either receive or remove a substrate 101. For example, as illustrated in FIG. 1 and in the loading position, the substrate 101 may rest on a plurality of lift pins 103 above the substrate support 100. The substrate support 100 may be disposed in a process chamber (a cut away view of a chamber wall 102 is illustrated in FIG. 1). The process chamber may be any suitable substrate processing chamber.

The substrate support 100 may include a body 104. The body 104 may have an interior volume 106 and outer volume 113. The interior volume 106 may be separated from a processing volume 108 of the process chamber. The interior volume 106 may be held at atmosphere, for example, about 14.7 pounds per square inch (psi), or be held under an inert atmosphere, such as nitrogen ($N_2$) or the like. The interior volume 106 is further isolated from, and protected from, any gases that may be present in the interior volume 106 of the process chamber. The process volume 108 may be held at atmospheric or sub-atmospheric pressures. The outer volume may be open to the processing volume 108 and may be used as a pass through volume for the lift pins 103. For example, the substrate support 100 may pass around the lift pins 103 (which are stationary) at upper lift pin holes 107 disposed in the electrostatic chuck 110 and lower lift pin holes 109 disposed in the body 104.

Figure 2:
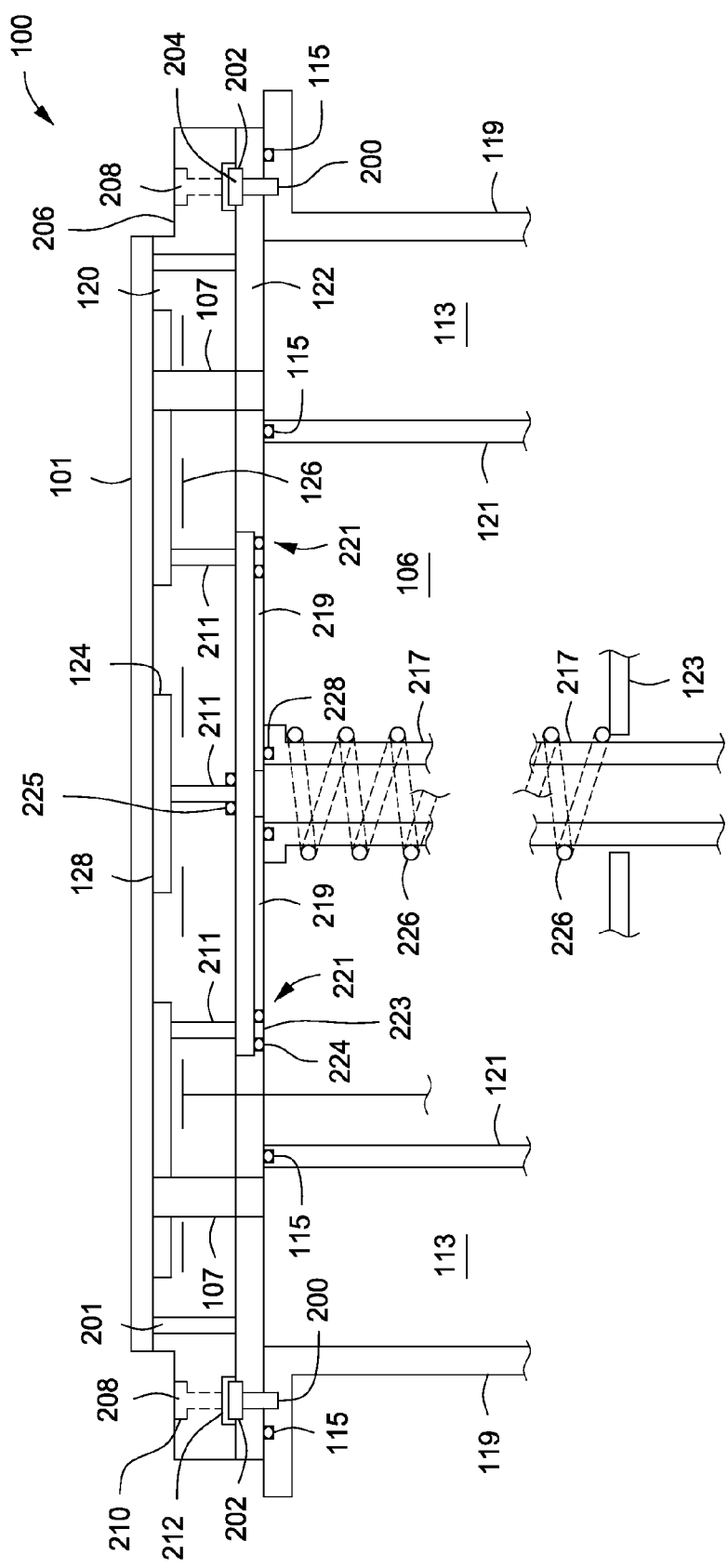
FIG. 2 depicts a side schematic view of an electrostatic chuck in accordance with some embodiments of the present invention.

The interior volume 106 may be enclosed by an electrostatic chuck 110 at an upper end 105 of the body 104 and by a feedthrough structure 111, which may be welded or brazed to a lower opening 114 of the body 104. For example, as illustrated in FIG. 1-2, a plurality of o-rings 115 may be disposed between each of an outer wall 119 and an inner wall 121 of the body 104 and the electrostatic chuck 110. As illustrated in FIGS. 1-2, the outer volume 113 may be formed between the inner and outer walls 119, 121. For example, as illustrated in FIG. 1, a bellows 112 may surround at least a portion of the feedthrough structure 111 and isolate the processing volume 108 from the exterior of the chamber and the interior volume 106. The bellows 112 may provide both a flexible section to facilitate motion of the substrate support 100 and a pathway for providing gases, electrical power, coolants and the like to the substrate support 100. The gases, electrical power, coolant and the like may be by provided via the feedthrough structure 111. As illustrated in FIG. 1, the feed through structure 111 may include a fixture 123 for providing individual gas, electric and coolant lines in the interior volume 106 from the feed through structure 111. The fixture 123 may be utilized to separate the individual gas, electric and coolant lines, and may comprise any suitable material for doing so. Although illustrated in FIG. 1 as resting on the body 104, the fixture 123 may be disposed at any suitable location such as within the feedthrough structure 111 or the like.

The bellows 112 may be coupled to the body 104 at the lower opening 114, for example, by welding or brazing. An opposing lower end 116 of the bellows 112 may be coupled to an opening 118 in the chamber wall 102. For example, as illustrated in FIG. 1, the lower end 116 of the bellow 112 may include a flange 117 which may be coupled via an o-ring 119, or copper gasket or the like to the chamber wall 102. The o-ring 119 may rest in a groove on the processing volume facing surface of the chamber wall 102. Other designs and coupling of the bellows 112 to the body 104 and the chamber wall 102 are possible.

The electrostatic chuck 110 may include a ceramic plate 120 and a base plate 122. As illustrated in FIG. 1, the ceramic plate 120 may rest on the base plate 122 and the base plate may be secured to the upper end 105 of the body 104. The ceramic plate 120 may comprise any suitable ceramic material, such as aluminum nitride (AlN), aluminum oxide ($Al_2O_3$), or a doped ceramic, such as titania doped alumina, ceria, samarium doped aluminum nitride or the like. As illustrated in FIG. 1, the ceramic plate 120 may include a plurality of grooves 124 formed in a substrate supporting surface of the ceramic plate 120. The grooves may be used, for example, to provide a backside gas to a backside surface of the substrate 101. The grooves are discussed in more detail below with respect to FIG. 3. The ceramic plate 120 may further include a plurality of electrodes 126, where the plurality of the electrodes 126 may be used to secure the substrate 101 a processing surface 128 of the electrostatic chuck 110. The electrodes 126 are discussed in more detail below and illustrated in FIGS. 4A-B. The base plate 122 may comprise one or more of molybdenum (Mo), aluminum (Al), titanium (Ti), silicon carbide-aluminum silicon alloy composite, or the like.

As illustrated in FIG. 2, the base plate 122 may be secured to the upper end 105 of the body 104 by a plurality of fasteners 200. Such a fastening method may permit the electrostatic chuck 110 to be detached, such as for servicing, replacement, or the like, from the substrate support 100.

For example, the fasteners 200 may be screws, bolts or the like as illustrated in FIG. 2. For example, the fasters may be used to compress an o-ring (such as the o-rings 115), gasket, or the like between the base plate 122 and the upper end 105 of the body 104 to form a seal. The fasteners 200 may be disposed about the base plate 122, for example, such as uniformly spaced to provide a uniform seal between the base plate 122 and the upper end 105. In some embodiments, the number of fasteners 200 used may be about 24.

In some embodiments, the fasteners 200 may be at least partially recessed into the base plate 122 as illustrated in FIG. 2. For example, the base plate 122 may include a plurality of counter bored openings 202 to at least partially recess the fastener 200. As illustrated in FIG. 2, each counter bored opening 202 partially recesses each fastener 200 such that a head 204 of each fastener may partially extend above the base plate 122. For example, in some embodiments, the head 204 of each fastener may extend above the base plate 122 up to about 2 millimeters. The fasteners may comprise any suitable material, such as one or more of stainless steel, titanium (Ti), or the like.

In some embodiments, the electrostatic chuck 110 may include a deposition ring 206 disposed about the ceramic plate 120 and covering at least some of the exposed portions of the base plate 122 as illustrated in FIG. 2. As illustrated in FIG. 2, a gap 201 exists between the ceramic plate 120 and the deposition ring 206. However, the gap 201 may be optional, and in some embodiments, the deposition ring 206 may contact the ceramic plate 120. The deposition ring 206 may comprise one or more of aluminum oxide ($Al_2O_3$), silicon carbide (SiC), stainless steel, titanium (Ti), or the like. The deposition ring 206 may be used to protect exposed portions of the base plate 122, the fasteners 200, or the like from damage during substrate processing or to prevent deposition of materials onto such surfaces. For example, plasma damage may include arcing or the like.

As illustrated in FIG. 2, the deposition ring 206 may have a surface profile that is approximately flat and below the level of the substrate 101 when disposed in a processing position on the processing surface 128 of the electrostatic chuck 110. Alternatively, (not shown) the deposition ring 206 may have a sloped profile such as thicker proximate a peripheral edge of the substrate 101 and thinner proximate a peripheral edge of the base plate 122. For example, a sloped profile may reduce an accumulation of contaminants, process materials, or the like on the deposition ring 206. Further, the deposition ring 206 may include a feature 212 disposed in locations of the lower surface of the deposition ring 206 to accommodate the heads 204 of the fasteners 200 such that the lower surface of the deposition ring 206 can contact the base plate 122. For example, the feature 212 may be a groove, or a plurality of recesses or slots configured to accommodate a head 204 of a fastener 200.

In some embodiments, the deposition ring 206 may be fastened to the base plate 122 by a plurality of fasteners 208. For example, the fasteners 208 may be screws, bolts, or the like as illustrated in FIG. 2. Similar to the fasteners 200, each fastener 208 may be at least partially recessed into a surface of the deposition ring 206 via a counter bored opening 210. The fasteners 208 are illustrated in a ghosted view in FIG. 2 to show that the fasteners 208 may be disposed at a similar radial length but at a different radial position than the fasteners 200 about the substrate support 100. For example, the fasteners 208 may comprise any suitable material, such as one or more of stainless steel, titanium (Ti), or the like.

As illustrated in FIG. 2, a gas source (i.e., gas source 130 discussed below and illustrated in FIG. 1) may be coupled to the plurality of grooves 124 via a central gas line 217. In some embodiments, the central gas line 217 may be coupled to the plurality of grooves 124 by a plurality of gas channels 219 disposed in the base plate 122. In some embodiments, the gas channels 219 are formed in an upper surface of the base plate 122 and covered by a lower surface of the ceramic plate 120. Alternatively, (not shown) the gas channels 219 may be disposed in the ceramic plate 120, the base plate 122, or a combination thereof. In some embodiments, (not shown) there may be about four gas channels 219, each gas channel 219 originating in the electrostatic chuck 110 proximate the central gas line 217. In some embodiments, each gas channel 219 may be coupled to a corresponding groove 124 via a porous plug 211. For example, the porous plug 211 may comprise any suitable porous ceramic material such as aluminum nitride (AlN), aluminum oxide ($Al_2O_3$), polyetheretherketone (PEEK), VESPEL®, or the like. The porous plugs 211 may be used to provide a gas to the grooves 124 at a desired flow rate, for example such as at a density or flow rate that will limit or prevent arc of gas due to proximity with the electrodes 126 which may be operated at high frequency and/or power as discussed below.

Further, it may be desirable to provide porous plugs 211 between each of the gas channels 219 and each of the grooves 124 (outer grooves 124) disposed about the central gas line 217. In such embodiments, a two plug structure may be used to more easily be able to insert the porous plug 211 while also keeping the interior volume 106 isolated from the processing volume 108. For example, a porous plug 211 may be inserted through an opening 221 in the base plate 122 and a second plug 223 including an o-ring 224 disposed thereabout may be inserted behind the plug 211 to seal the opening 221. The porous plug 211 disposed through the opening 221 may further (optionally) include an o-ring (such as an o-ring 225) disposed about the porous plug to hold it securely in the ceramic plate 120. Further, in some embodiments (not shown) each porous plug 211 may abut a plurality of holes fluidly disposed in a base of the grooves 124 and coupling the grooves 124 to the gas channels 219 via each porous plug 211. The plurality of holes may be smaller than the diameter of each porous plug 211, thus preventing each porous plug 211 from entering the grooves 124. Further, when an o-ring, such as o-ring 225 is used, a groove (not shown) may be formed on the outer surface of the plug 211 to accommodate the o-ring 225.

In some embodiments, the central gas line 217 may be pressed against a backside surface of the base plate 122 using a spring loaded mechanism. For example, as illustrated in FIG. 2, a spring 226 may be disposed about the outside of the central gas line 217. The spring 226 may operate in tension to press an o-ring 228 disposed at an end of the central gas line 217 against the backside surface of the base plate 122 to form a seal between the gas line 217 and the backside surface of the base plate 122. The spring 226 may press against the fixture 123 at a lower end of the spring 226 to provide the necessary tension to press the o-ring 228 against the backside surface of the base plate 122 as illustrated in FIG. 2.

Figure 3:
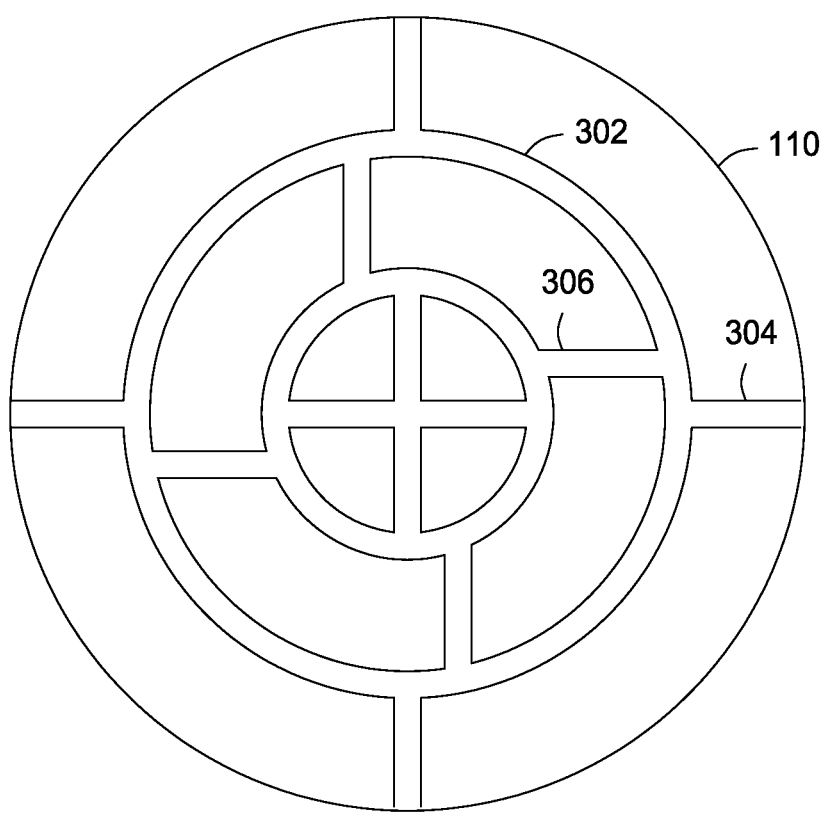
FIG. 3 depicts a top down schematic view of grooves in a substrate facing surface of an electrostatic chuck in accordance with some embodiments of the present invention.

The plurality of grooves 124 disposed in the processing surface 128 of the electrostatic chuck 110 is illustrated in accordance with some embodiments of the invention in FIG. 3. For example, as discussed above the plurality of grooves 124 may be utilized to provide a gas to the backside of the substrate 101. For example, the gas may be used to facilitate uniform heat transfer between the ceramic plate 120 and the substrate 101. Further, the pressure of the grooves 124 may be monitored, for example, by a pressure transducer or any suitable pressure sensing device. For example, a pressure drop in the grooves 124 may signal that the substrate 101 is damaged, for example, such as cracked or the like. As a result of the pressure drop, the deposition process in the chamber may shut down to prevent exposure of the electrostatic chuck 110 to the process environment.

In some embodiments, the plurality of grooves 124 may include a plurality of circular grooves 302, a plurality of radial grooves 304, and a plurality of offset grooves 306, as illustrated in FIG. 3. In some embodiments, offset grooves 306 are non-radial offset grooves. As used herein, non-radial offset grooves are grooves that do not follow with a line which extends radially from the center of the ceramic plate 120. For example, in some embodiments, the plurality of circular grooves 302 may be concentric and fluidly coupled via the plurality of offset grooves 306. The plurality of radial grooves 304 may be fluidly coupled and disposed at the interior of an innermost circular groove and at the exterior of the outermost circular groove. However, this design is merely exemplary and other configurations are possible. For example, in some embodiments, the radial grooves do not continuously extend from the interior of the ceramic plate 120 to a peripheral edge of the ceramic plate 120. In some embodiments, the radial grooves do not extend more than between one set of circular grooves, or do not extend longer than any length suitable to limit arcing by the plasma in the grooves 124. For example, arcing may occur at high power or high frequency in long, continuous radial grooves. Accordingly, in some embodiments the plurality of offset grooves 306 is introduced to limit the length of the radial grooves 304. For example, arcing may occur in a gas flowing through the grooves at high power and/or high frequency if long, continuous radial grooves are used. In some embodiments, the length of the radial and/or offset grooves 304, 306 may range from about 2 to about 5 centimeters. However, other lengths may be utilized.

Figure 4A:
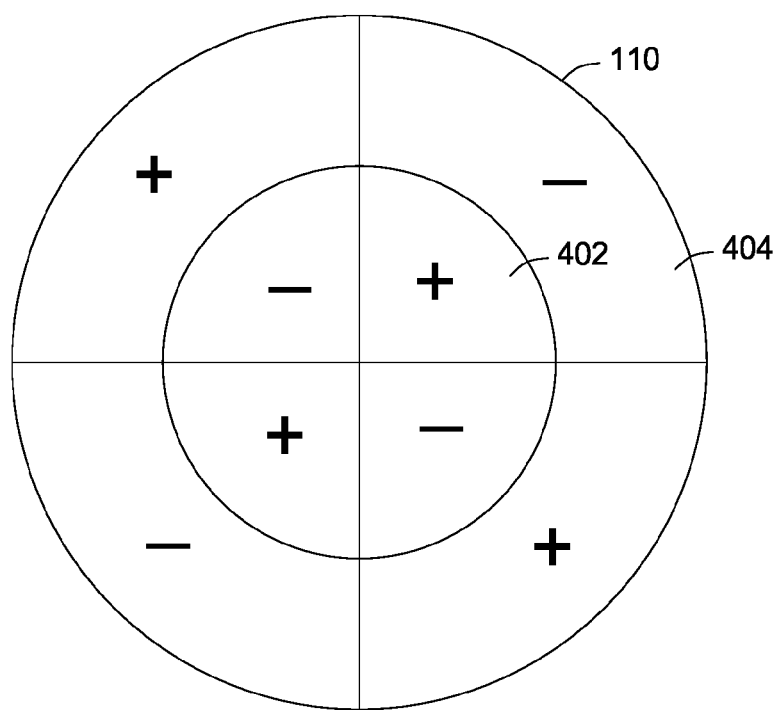
FIGS. 4A-B depict top down schematic views of electrodes in an electrostatic chuck in accordance with some embodiments of the present invention.
Figure 4B:
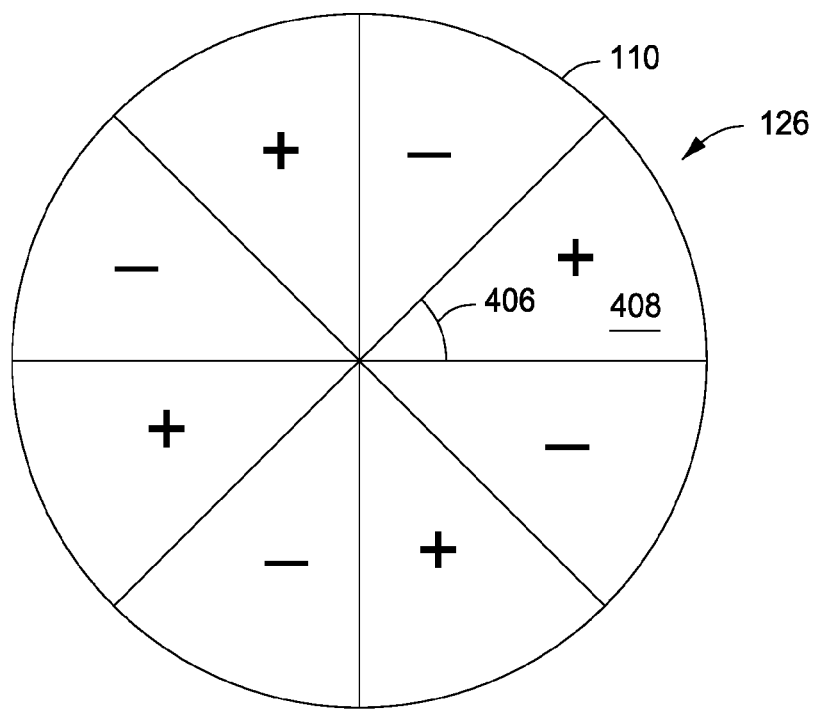

FIGS. 4A-B illustrate the plurality of electrodes 126 in accordance with some embodiments of the invention. For example, as discussed above the plurality of electrodes 126 may be utilized to secure the substrate 101 to the processing surface 128 of the electrostatic chuck 110. For example, in some embodiments, the plurality of electrodes 126 as arranged in FIGS. 4A-B may utilized for controlled de-chucking from the electrostatic chuck 110, to chuck bowed substrates, or the like. For example, during de-chucking, gas may still be flowing through the grooves 124 and/or the pressure in the grooves may be higher than the pressure in the processing volume 108. Accordingly, for example, to prevent the substrate 101 from jumping off the electrostatic chuck 110, some of the electrodes 126 may be turned off prior to others to gradually de-chuck the substrate 101. For example, during chucking, larger substrates, such as 400 millimeter or greater, may be bowed. Accordingly, to flatten a bowed substrate against the electrostatic chuck 110, some of the electrodes 126 may be operated at a higher power and/or frequency that others of the electrodes 126 to flatten out the substrate.

As illustrated in FIG. 4A, the plurality of electrodes 126 may be arranged in a concentric pattern, wherein a plurality of exterior electrodes 404 are disposed about a plurality of interior electrodes 402. For example, as illustrated in FIG. 4A, each quadrant of the ceramic plate 120 includes one exterior electrode 404 disposed radially outward of one interior electrode. However, any suitable number of interior and exterior electrodes 402, 404 may be utilized. In addition, the polarity of respective adjacent electrodes may be controlled to be opposite of each other such that no two adjacent electrodes have the same polarity.

As illustrated in FIG. 4B, the plurality of electrodes 126 may be arranged in a radial pattern about the ceramic plate 120, wherein each electrode occupies an area 406 between a center and peripheral edge of the ceramic plate 120 defined by a radial angle 408. For example, as illustrated in FIG. 4B, in some embodiments, there may be eight electrodes 126 occupying eight areas 406, where each area 406 is defined by the same radial angle 408. In addition, the polarity of respective adjacent electrodes may be controlled to be opposite of each other such that no two adjacent electrodes have the same polarity.

Returning to FIG. 1, the substrate support 100 may include the feedthrough structure 111 to provide a pathway, for example, to provide gas to the plurality of grooves 124, provide electrical power to the plurality of electrodes 126, or the like from sources external to the process chamber. For example, as illustrated in FIG. 1, a gas source 130 and power sources 131, 132 may be respectively coupled via the feedthrough structure 111 to the plurality of grooves 124 and the plurality of electrodes 126. For example, (not shown) the power sources 131, 132 may be a plurality of power sources, for example, such that each power source may be coupled to each electrode 126 such that each electrode 126 may be independently controlled. For example, the power source 132 may be utilized to provide RF power at a frequency ranging from about 13.56 MHz to about 100 MHz. In some embodiments, the frequency may be about 60 MHz. For example the power source 131 may be used to provide DC power, for example, to chuck or de-chuck the substrate 101. For example, the gas source 130 may be coupled to the plurality of grooves 124 via the central gas line 217 as illustrated in FIG. 2.

Optionally, the substrate support 100 may include a cooling plate 134 disposed in the interior volume 106 below the base plate 122 of the electrostatic chuck 110. For example, as illustrated in FIG. 1, the cooling plate 134 may be directly contacting an interior volume facing surface of the base plate 122. However, this embodiment of the cooling plate 134 is merely exemplary and the cooling plate may not directly contact the base plate 122. The cooling plate 134 may include a plurality of cooling channels (not shown) for circulating a coolant therethrough. For example, the coolant may include any suitable liquid or gas coolant. The coolant may be supplied to the cooling plate 134 via a coolant source 136 coupled to the cooling plate 134 via the feedthrough structure 111. Although illustrated as occupying a small portion of the body 104, in some embodiments, the cooling plate 134 may extend towards the feedthrough structure 111 to occupy a substantial portion of the interior volume 106 and/or the outer volume 113. The cooling plate 134 may have a substantially similar area as the substrate 101 as illustrated in FIG. 1. Thus, the cooling plate 134 may be able to provide cooling to substantially all areas of the substrate 101.

In operation, to move the substrate support from a loading position to a processing position, a lift mechanism 138 may engage the feedthrough structure 111 such that the feedthrough structure 111 lifts the substrate support 100 into the processing position. The lift pins 103 may remain stationary as the substrate support 100 is raised towards the substrate 101 which rests on the lift pins 103 as illustrated in FIG. 1.

While the foregoing is directed to embodiments of the present invention, other and further embodiments of the invention may be devised without departing from the basic scope thereof.

We claim:

1. An electrostatic chuck for retaining a substrate, comprising:
   a base plate;
   a ceramic plate, supported by the base plate, having a substrate supporting surface;
   a body coupled to the base plate forming an enclosed cavity below the base plate, wherein the enclosed cavity includes a radially inner hollow volume and a radially outer hollow volume, wherein the radially inner hollow volume is sealed and not fluidly coupled to the substrate supporting surface, and wherein the radially outer hollow volume is fluidly coupled to the substrate supporting surface;
   a gas line pressed against a backside surface of the base plate using a spring;
   a first plurality of electrodes disposed within the ceramic plate having a first polarity; and
   a second plurality of electrodes disposed within the ceramic plate having a second polarity opposite from the first polarity, wherein each of the first and second plurality of electrodes are coupled to an RF power source and a DC power source to independently control each electrode to provide a desired chucking power and frequency.

2. The electrostatic chuck of claim 1, wherein the first and second plurality of electrodes are disposed in a concentric pattern such that the first and second plurality of electrodes include a plurality of exterior electrodes disposed about a plurality of interior electrodes.

3. The electrostatic chuck of claim 1, wherein the first and second plurality of electrodes are disposed in four quadrants of the ceramic plate, and wherein each quadrant of the ceramic plate includes one exterior electrode disposed radially outward of one interior electrode.

4. The electrostatic chuck of claim 3, wherein a polarity of respective adjacent electrodes is opposite of each other such that no two adjacent electrodes have the same polarity.

5. The electrostatic chuck of claim 1, wherein the first and second plurality of electrodes are alternately arranged in a radial pattern about the ceramic plate such that no two adjacent electrodes have the same polarity.

6. The electrostatic chuck of claim 5, wherein the first and second plurality of electrodes include a total of eight electrodes, and wherein each electrode occupies an area between a center of the ceramic plate and a peripheral edge of the ceramic plate defined by an equivalent radial angle.

7. The electrostatic chuck of claim 1, wherein each of the first plurality of electrodes, and each of the second plurality of electrodes are independently controllable.

8. The electrostatic chuck of claim 1, wherein the radially inner hollow volume and the radially outer hollow volume are separated by an inner wall disposed in the enclosed cavity below the base plate of the electrostatic chuck.

9. The electrostatic chuck of claim 1, wherein a cooling plate is at least partially disposed in the radially inner hollow volume and the radially outer hollow volume below the base plate of the electrostatic chuck.

10. The electrostatic chuck of claim 1, wherein the radially outer hollow volume is coupled to the substrate supporting surface via one or more lift pin holes.

11. An electrostatic chuck for retaining a substrate, comprising:
a base plate;
a ceramic plate, supported by the base plate, having a substrate supporting surface;
at least one electrode disposed within the ceramic plate; and
a plurality of grooves formed in the substrate supporting surface of the ceramic plate, wherein the plurality of grooves include one or more circular grooves disposed concentrically about a central axis of the ceramic plate, one or more radial grooves fluidly coupled to the one or more concentric circular grooves, and one or more non-radial offset grooves fluidly coupled to the one or more concentric circular grooves, wherein each of the one or more non-radial offset grooves are linear grooves, wherein a length of each of the one or more non-radial offset grooves is selected to limit arcing, and wherein none of the one or more radial grooves continuously extend from an interior of the ceramic plate to a peripheral edge of the ceramic plate.

12. The electrostatic chuck of claim 11, wherein the one or more concentric circular grooves includes a plurality of concentric circular grooves fluidly coupled to each other via the one or more non-radial offset grooves.

13. The electrostatic chuck of claim 12, wherein the plurality of concentric circular grooves includes an innermost circular groove and an outermost circular groove.

14. The electrostatic chuck of claim 13, wherein the one or more non-radial offset grooves includes four non-radial offset grooves evenly spaced apart from each other, each non-radial offset groove fluidly coupling the innermost circular groove to the outermost circular groove.

15. The electrostatic chuck of claim 13, wherein the one or more radial grooves includes a plurality of radial grooves, wherein at least one of the plurality of radial grooves is fluidly coupled to an inner radius of an innermost circular groove and extends towards a center of the ceramic plate, and at least one of the plurality of radial grooves is fluidly coupled to an outer radius of an outermost circular groove and extends towards a peripheral edge of the ceramic plate.

16. The electrostatic chuck of claim 11, wherein the one or more radial grooves and the one or more non-radial offset grooves are sized to limit arcing by a plasma in a gas flowing through the plurality of grooves.

17. The electrostatic chuck of claim 16, wherein a length of the one or more radial grooves and the one or more non-radial offset grooves is from about 2 centimeters to about 5 centimeters.

18. The electrostatic chuck of claim 11, further comprising:
a set of gas channels disposed in at least one of the base plate or the ceramic plate, configured to provide a gas to the plurality of grooves, wherein each gas channel in the set of gas channels is coupled to a corresponding one of the plurality of grooves via a porous plug.

19. An apparatus for processing a substrate, comprising:
a chamber defining a process region;
an electrostatic chuck for retaining a substrate in the process region, the electrostatic chuck comprising:
a base plate;
a ceramic plate, supported by the base plate, having a substrate supporting surface;
first plurality of electrodes disposed within the ceramic plate having a first polartiy; and
a second plurality of electrodes disposed within the ceramic plate having a second polarity opposite from the first polarity, wherein the first and second plurality of electrodes are independently controllable to provide a desired chucking power and frequency; and
a plurality of grooves formed in the substrate supporting surface of the ceramic plate, wherein the plurality of grooves include one or more concentric circular grooves about a central axis of the ceramic plate, one or more radial grooves fluidly coupled to the one or more concentric circular grooves, and one or more non-radial offset grooves fluidly coupled to the one or more concentric circular grooves, wherein each of the one or more non-radial offset grooves are linear grooves, wherein a length of each of the one or more non-radial offset grooves is selected to limit arcing, and wherein none of the one or more radial grooves continuously extend from an interior of the ceramic plate to a peripheral edge of the ceramic plate; and
a plurality of power sources, each power source coupled to a corresponding electrode in the plurality of electrodes such that each electrode is independently controlled.

* * * * *